(12) United States Patent
Kwark

(10) Patent No.: US 7,764,062 B2
(45) Date of Patent: **\*Jul. 27, 2010**

(54) METHOD AND STRUCTURE FOR VARIABLE PITCH MICROWAVE PROBE ASSEMBLY

(75) Inventor: Young Hoon Kwark, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/346,308

(22) Filed: Dec. 30, 2008

(65) Prior Publication Data

US 2009/0102451 A1 Apr. 23, 2009

Related U.S. Application Data

(63) Continuation of application No. 11/580,033, filed on Oct. 13, 2006, now Pat. No. 7,492,143, which is a continuation of application No. 10/827,230, filed on Apr. 20, 2004, now Pat. No. 7,161,344.

(51) Int. Cl.
*G01R 31/02* (2006.01)
(52) U.S. Cl. .................................................. 324/72.5
(58) Field of Classification Search ................. 324/72.5
See application file for complete search history.

(56) References Cited

U.S. PATENT DOCUMENTS

| | | | |
|---|---|---|---|
| 2,741,745 A | 4/1956 | Dibos | |
| 2,922,963 A | 1/1960 | Beatty | |
| 3,392,354 A | 7/1968 | Plutchok | |
| 3,445,766 A | 5/1969 | Valliere et al. | |
| 3,447,078 A | 5/1969 | Levy | |
| 3,537,000 A | 10/1970 | Easi | |
| 4,829,242 A * | 5/1989 | Carey et al. | 324/72.5 |
| 5,214,389 A | 5/1993 | Cao et al. | |
| 5,959,512 A | 9/1999 | Sherman | |
| 6,191,594 B1 | 2/2001 | Nightingale et al. | |
| 6,242,930 B1 | 6/2001 | Matsunaga et al. | |
| 6,404,215 B1 | 6/2002 | Nightingale et al. | |
| 6,828,768 B2 | 12/2004 | McTigue | |
| 6,967,473 B1 | 11/2005 | Reed et al. | |
| 2003/0107363 A1 | 6/2003 | Tsironis | |

OTHER PUBLICATIONS

M. R. Marasch, et al., "Test Probe with Variable Ground and Constant Impedance Capabilities", IBM Technical Disclosure Bulletin, vol. 18, No. 3, Aug. 1975, pp. 699-700.
A. L. Perlman et al., "Coaxial Probe Structure with Variable Spaceable Ground Lead", IBM Technical Disclosure Bulletin, vol. 20, No. 5, Oct. 1977, p. 1755.
"Agilent N1022A Probe Adapter", Agilent Technologies product description, 2003.

\* cited by examiner

*Primary Examiner*—Timothy J Dole
(74) *Attorney, Agent, or Firm*—McGinn IP Law Group, PLLC

(57) ABSTRACT

A coplanar waveguide (CPW) probe includes at least one center probe element, each having a respective center probe contact point and at least one peripheral probe element, each having a respective peripheral contact point. The pitch between the at least one center contact point and the at least one peripheral contact point is adjustable.

13 Claims, 4 Drawing Sheets

METHOD AND STRUCTURE FOR VARIABLE PITCH MICROWAVE PROBE ASSEMBLY

The present Application is a Continuation Application of U.S. patent application Ser. No. 11/580,033, filed on Oct. 13, 2006, now U.S. Pat. No. 7,492,143, which is a Continuation Application of U.S. application Ser. No. 10/827,230, filed on Apr. 20, 2004, now U.S. Pat. No. 7,161,344.

BACKGROUND OF THE INVENTION

1. Field of the Invention

The present invention generally relates to test probes for characterizing microwave frequency circuits and packages. More specifically, a variable pitch air coplanar waveguide (CPW) structure allows the pitch of the CPW tips to be adjusted to accommodate a range of pad pitches with minimal degradation in the microwave performance of the probe launch.

2. Description of the Related Art

High performance (e.g. 40 GHz bandwidth) microwave probes are currently available for on-wafer testing of microwave frequency circuits. They are also being used increasingly for package level characterization as well.

These probes are usually constructed of very small diameter micro-coaxial cable which is terminated on the device-under-test (DUT) end in an air coplanar waveguide (CPW) structure in a Ground-Signal-Ground (G-S-G) or similar configuration. A serious disadvantage of these probes is their high cost (in some cases, averaging $600 per probe). Since the CPW tips are fixed in pitch, a different probe needs to be purchased for each significant change in pad pitch or package geometry.

SUMMARY OF THE INVENTION

A representative view 100 of fixed pitch probes is shown in FIG. 1. The left probe 101 shows the CPW region for a Ground-Signal-Ground (G-S-G) configuration, the other two probes 102, 103 show variants in which only a single ground contact is provided (e.g., signal-ground or S-G probes). The pitch (e.g., separation between contact points) is depicted in FIG. 1 as exemplarily being 0.15 mm or 0.3 mm.

The probe tips 104,105,106 can be considered as extensions of a high frequency micro-coaxial cable 107 in which the internal conductor shown connected to tip 108 carries a signal and the outer jacket 109 conveys the return current. The ground tips 110 are typically brazed or soldered to the outer wall 109 of the micro-coaxial cable 107. A variation not shown in FIG. 1 is a G-S-S-G probe, in which there are two internal signal conductors rather than only one.

The CPW probes shown in FIG. 1 are well known in the art, and there is no need to further discuss the design details of these probes in order to discuss the present invention.

However, it is noted that the electrical performance of any component, such as a testing probe, used at the high frequencies inherent in the microwave range is extremely sensitive to changes in shape and dimensions. This is one reason that conventional CPW probes are fixed in pitch since it simplifies the optimization of shape and dimensions.

A key function of the CPW probe is to provide a smooth transition between transmission modes. For example, in the micro-coaxial cable, the cylindrical configuration of the micro-coaxial structure sustains the transverse electric magnetic (TEM) mode of transmission. However, the DUT may be conducting a different mode. A key function of the conventional CPW probe is to provide a smooth transition between the mode in the DUT and the TEM mode in the micro-coax. Therefore, it is critical that a CPW probe design not permit reflections or attenuations at microwave frequencies that would disrupt this smooth transition between modes.

Because of the fixed configuration of conventional microwave probes, the high cost for each probe, and the technical constraints of maintaining a proper transition at the probe, there are currently no CPW microwave probes that have an adjustable pitch for the contacts.

Although circuits fabricated on semiconductor wafers are typically designed so that the pitch of the terminals meet a standard pitch, such as the 150 μm or 300 μm pitch shown in FIG. 1, in packaging or printed circuit cards, there are many standards and designs for the pitch.

Therefore, a need exists for a CPW microwave probe that can be adjusted for various pitches without compromising the electrical performance required to be maintained at these high frequencies.

Apart from saving the inventory costs of stocking many different probe tip pitches, a probe tip having adjustable pitch would enable quick measurements of many different package and circuit geometries to be made without paying the penalty of fabrication lead time for these probes. Moreover, it is often the case that the long lead time for these probes can represent a more significant economic penalty than the costs of the probes themselves.

In view of the foregoing, and other, exemplary problems, drawbacks, and disadvantages of the conventional system and probe, it is an exemplary feature of the present invention to provide a microwave probe that has an adjustable pitch.

It is another exemplary feature of the present invention to provide a microwave probe that has adjustable pitch and that maintains the critical electrical interface requirements in the microwave range.

It is another exemplary feature of the present invention to reduce the cost of testing microwave components by providing a test probe that can be adjusted for different test contact pitches, thereby precluding the need to maintain a large inventory of probes having different pitches.

To achieve the above exemplary features and others, in a first exemplary aspect of the present invention, described herein is a coplanar waveguide (CPW) probe including at least one center probe element, each having a respective center probe contact point, and at least one peripheral probe element, each having a respective peripheral contact point, wherein a pitch of the at least one center contact and the at least one peripheral contact is adjustable.

In a second exemplary aspect of the present invention, also described herein is a test probe assembly including a micro-coaxial cable having at least one center conductor and a conductive outer wall and a probe tip section comprising at least one center contact, each respectively extending from the at least one center contact, and at least one peripheral contact, each electrically connected to the conductive outer wall, wherein a pitch between the at least one center contact and the at least one peripheral contact is adjustable.

In a third exemplary aspect of the present invention, also described herein is a method of testing an electronic circuit operating in a microwave range of wavelength, including making an adjustment of a contact pitch on an air coplanar waveguide (CPW) probe having an adjustable contact pitch and placing the contacts of the CPW probe in contact with test points of the electronic circuit.

In a fourth exemplary aspect of the present invention, also described herein is a method of fabricating a micro-coaxial probe assembly, including attaching at least one peripheral probe tip element to an outer wall of a micro-coax assembly having at least one center conductor, the center conductor being extended to serve as an inner probe element for testing a test point, and at least one peripheral probe tip element being attached to the outer wall a predetermined distance from an end of the inner probe element to be used to contact a test point; and incorporating an interface on the outer wall for a mechanism that allows the at least one peripheral probe tip element to be adjusted in separation from the at least one center conductor.

Thus, the present invention provides a structure and method for improved testing of circuits operating in the microwave region by providing a test probe having an adjustable pitch that maintains the electrical aspects of the interface transition over the adjustable range, thereby providing a universal probe that can be used for different test point pitches.

BRIEF DESCRIPTION OF THE DRAWINGS

The foregoing and other exemplary features, aspects and advantages will be better understood from the following detailed description of an exemplary embodiment of the invention with reference to the drawings, in which.

DETAILED DESCRIPTION OF AN EXEMPLARY EMBODIMENT OF THE INVENTION

Figure 1:
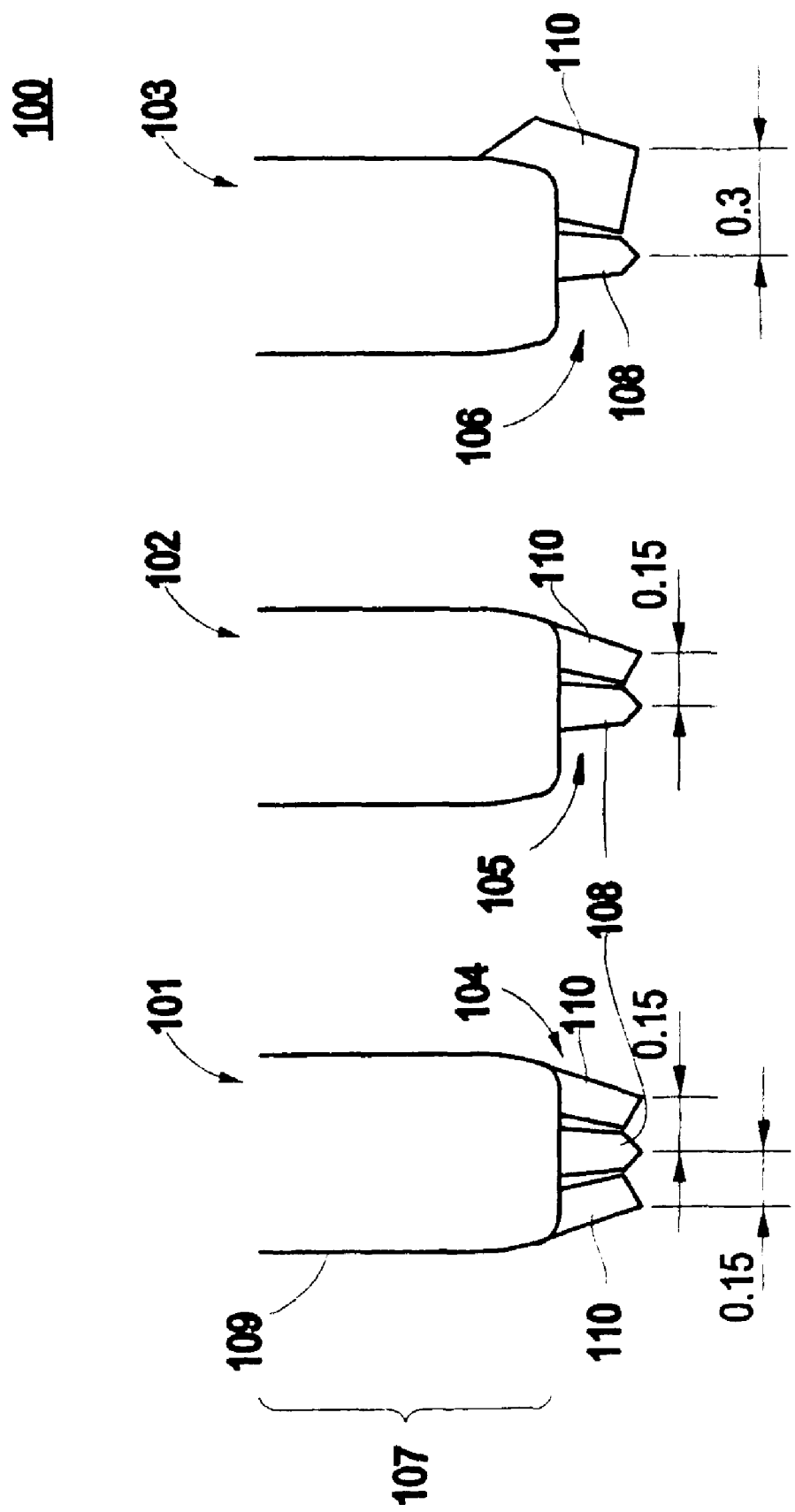
FIG. 1 shows a view 100 of the DUT tip region of various configurations of conventional microwave probes.

Referring now to the drawings, and more particularly to FIGS. 2-5, an exemplary embodiment 200 of the present invention will now be described.

Figure 2:
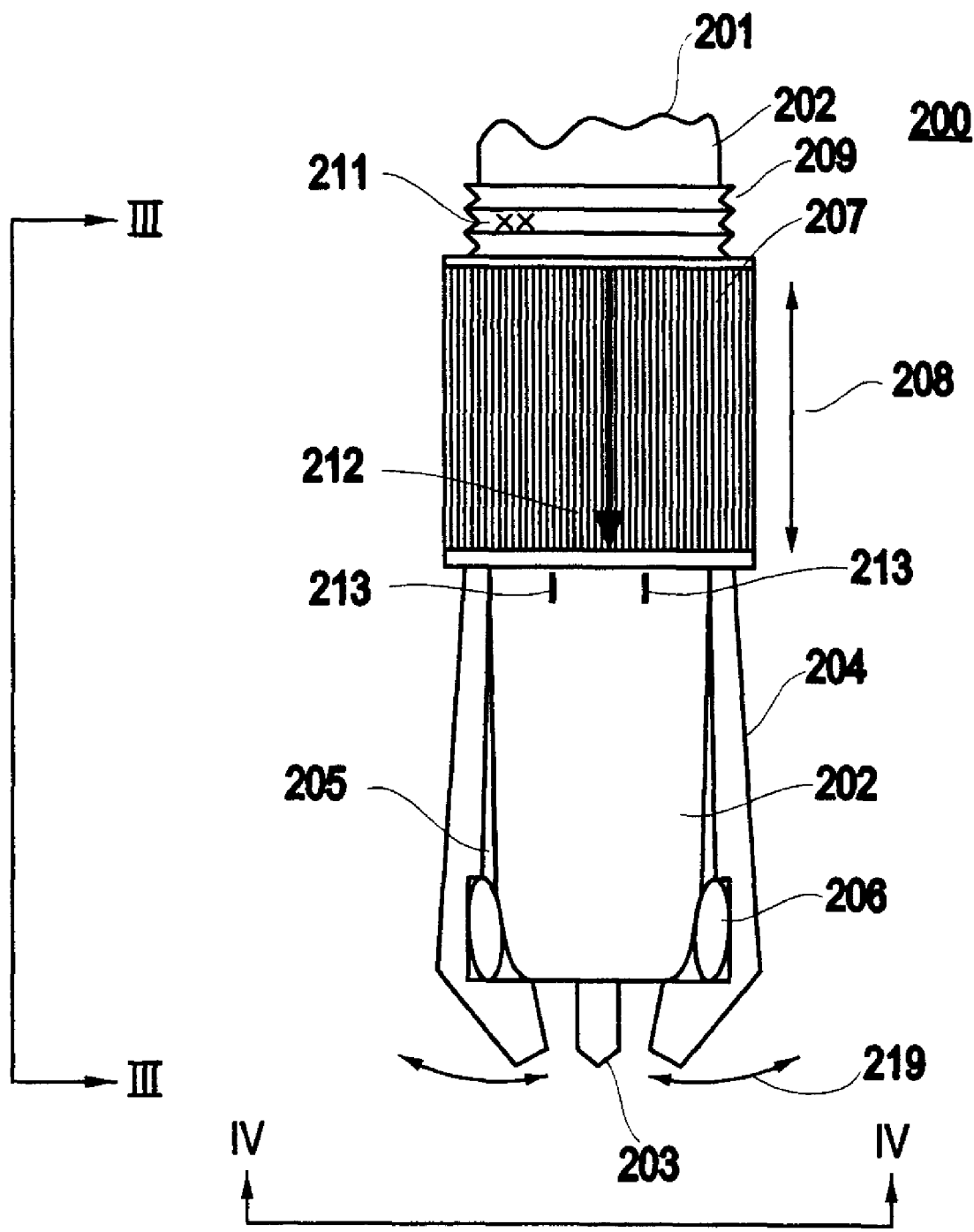
FIG. 2 shows an exemplary embodiment 200 of an adjustable microwave probe configuration in accordance with the concepts of the present invention.
Figure 3:
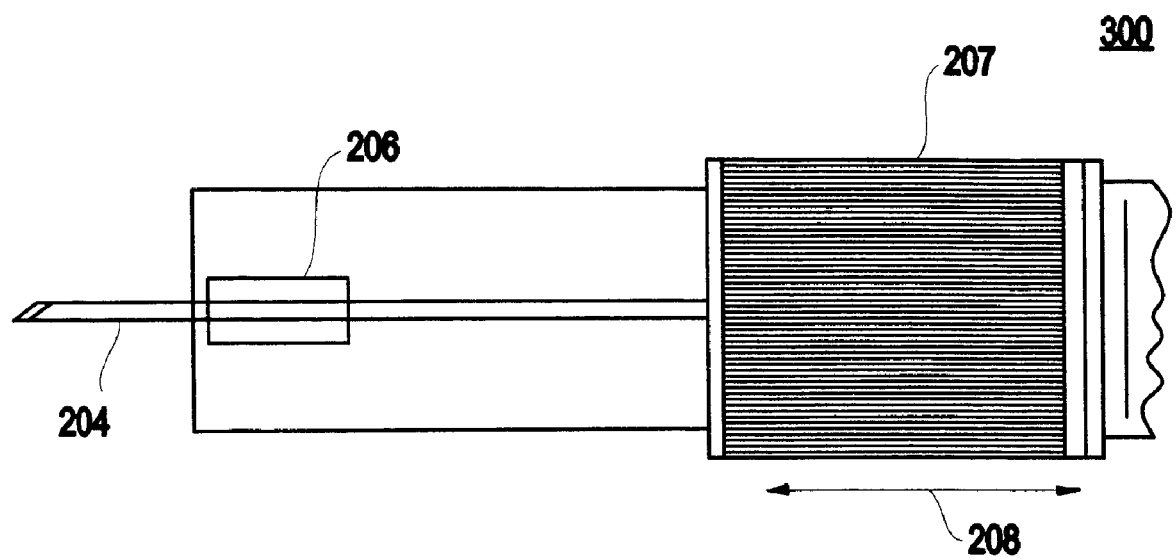
FIG. 3 shows a side view 300 of the exemplary embodiment 200.
Figure 4:
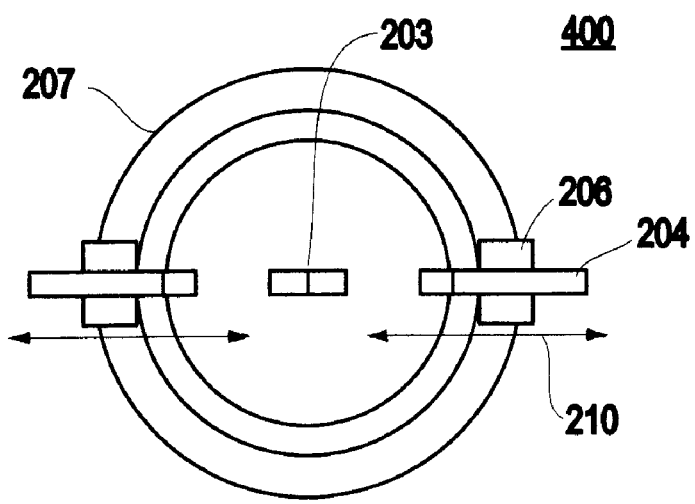
FIG. 4 shows an end view 400 of the exemplary embodiment 200.

The present invention modifies the geometry of the conventional tips of these microwave probes (e.g., as shown in FIG. 1) to permit the user to set the pitch between the tip contact points over a wider range while maintaining minimal degradation in the high frequency performance. FIG. 2 shows key concepts of the present invention in greater detail, and FIGS. 3 and 4 show respective plane views looking from the perspectives indicated in FIG. 2.

The exemplary adjustable air coplanar waveguide (CPW) probe 200 of the present invention includes:

a section of micro-coaxial 201, having outer wall 202 and center conductor 203;

at least one peripheral probe element 204 (exemplarily, a probe element for ground) attached to the outer wall 202 such that the shape presents a taper that leaves a variable gap 205 between the outer wall 202 and the ground probe element 204;

a flexure member (e.g., a spreader member such as a spring) 206 that pushes the ground probe element 204 away from the outer wall 202; and a sleeve 207 that can move longitudinally 208 along the outer wall 202, as exemplarily movable along threads 209 on the outer wall 202, the longitudinal movement 208 thereby causing the ground probe element(s) 204 to swing in an arc 210, thereby changing pitch relative to signal probe element 203.

In contrast to the conventional probe, the inventive probe avoids the hard attachment of the ground tips 204 at the end of the micro-coaxial next to the probe contact area. Rather, the ground tips 204 are attached further back and are formed in such a way as to permit flexure so that they can be separated away from the wall of the micro-coaxial in variable amounts, as shown in FIG. 2.

Additionally, the present invention includes, exemplarily, a knurled sleeve 207 which mates onto a thread 209 that is either machined into the wall of the micro-coaxial or attached to it. Turning this sleeve results in translation of the sleeve in a longitudinal direction. This action coupled with the taper formed into the ground tip pieces either increases or decreases the separation between the ground tips, thereby effecting the change in pitch.

The present invention includes a flexure member (e.g., spring) 206 to provide a reliable mechanism to keep the ground tip pieces 204 engaged against the inner surface of the knurled sleeve 207. This mechanical function could be accomplished using the spring forces in the ground tips 204 alone, but the presence of the spring 206 provides a more reliable restoring force. In addition, the spring member 206 plays an important electrical function of providing a short path for the return ground current directly from the contact points of the ground tips to the sidewall 202 of the micro-coaxial 201. Without this short path, high frequency performance may be compromised by a large ground inductance.

This spring 206 can be fabricated from, for example, BeCu or any other good conductor with similar mechanical properties. It is also possible to use a conductor-loaded elastomeric button or a "fuzz button" in this role as spring 206.

These features described above can also be extended so as to be incorporate in the single sided Ground-Signal or Signal-Ground probes 102, 103 shown in FIG. 1. It should be apparent to one having ordinary skill in the art, after taking the discussion herein as a whole, that the concepts herein could also be extended to ganged multiple tip geometries in which there is more than one signal conductor (e.g., G-S-S-G probes).

Additionally, it should be apparent that, depending upon the specific manner in which the sleeve 207 is adapted to slide along the outer wall 202, the outer wall 202 of the micro-coaxial may require a bit of stiffening in the region where the threaded section 209 and the sleeve 207 are located, in which case the outer wall might, for example, receive additional layer(s) of material during fabrication or have an additional layer or layers of material added to this area especially for the purpose of strengthening the outer wall for purpose of an interface with the sleeve 207.

Another possible modification to the basic concepts described above might include, for example, a calibration scale 211 associated with positioning of the sleeve, so that a user can make a setting, or at least an approximate setting, without having to view the results of the adjustment under a microscope while making the initial adjustment.

It should be apparent to one of ordinary skill in the art, after taking this disclosure as a whole, that the calibration scale could be based on either a calibration indication based on the longitudinal position of the sleeve, whereby the calibration markings 211 might be located somewhere on the sidewall 202 or threaded interface 209 of the micro-coaxial cable. Alternatively, depending upon the details of the shape of the taper of the peripheral probe element 204 and the size of the thread 209, the calibration might more accurately be calibrated throughout the intended range of the probe within one or two rotations of the sleeve. In this configuration, the calibration could then be indicated by a calibration marker 212 on the sleeve 207, in combination with calibration markers 213 on the sidewall 202 of the micro-coaxial cable 201.

There are design tradeoffs to be considered for a probe assembly of the present invention. Thus, in a non-limiting example, the exemplary configuration 200 might have a span of 2:1 or 3:1, meaning that one variable pitch probe might span, for example, pitches of 50-150 microns (e.g., total GND-GND separation of 100-300 microns in the configuration shown in FIG. 2). A second exemplary probe might cover a second range of 300-900 microns.

These two probes would provide coverage of most current high frequency applications, but it should be apparent that a wider range could be used. The design tradeoff concern is that a wider range provides a probe design that provides "only" a few GHz with acceptable probe performance.

Figure 5:
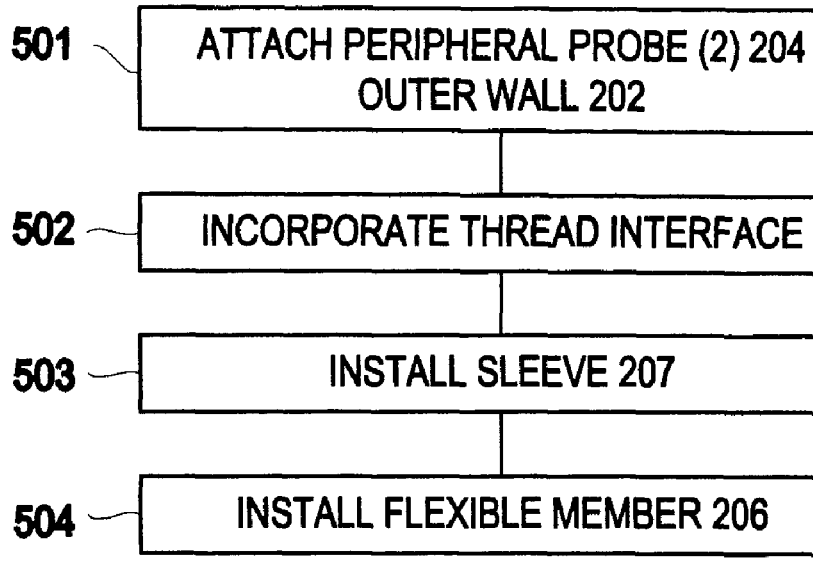
FIG. 5 shows an exemplary fabrication process 500 of exemplary embodiment 200.

FIG. 5 shows an exemplary fabrication process 500, as based on modifying a fabrication process of a conventional probe assembly such as shown in FIG. 1. Thus, for sake of illustration, it is assumed that a partial fabrication is complete for an assembly similar to micro-coaxial assembly 101, having an outer wall 109 and center conductor 108 but no peripheral probe tips 110 yet installed. In accordance with the exemplary structure shown in FIG. 2, in step 501 of FIG. 5, the two peripheral probe tip elements 204 would be affixed to the outer wall by, for example, soldering or brazing, at a location away from the tip of the assembly, near the location that the sleeve 207 is to be installed.

In step 502, the interface for the sleeve is incorporated on the outer wall 202. In the exemplary configuration of FIG. 2, this interface is a threaded arrangement on the outer wall 202 that matches an internal thread on the sleeve 207, but other mechanisms are possible, as long a the sleeve 207 can move longitudinally along the taper of the peripheral probe tip element 204.

The thread interface 209 might be achieved by machining the outer wall 202 of the micro coax, or it might be achieved by mounting, attaching, or otherwise affixing, a collar that has an external threaded surface to the outer wall 202. It might be necessary to strengthen the area of the threaded interface, especially if the thread is machined directly into the outer wall 202.

In step 503, the sleeve 207 is installed, by slipping it over the peripheral probe tip elements 204 and onto the sleeve interface (e.g., screwing it onto the external screws of the thread interface). Finally, in step 204, the flexible member 206 is inserted to force the peripheral probe tip elements 204 outward and provide the short current return path.

Figure 6:
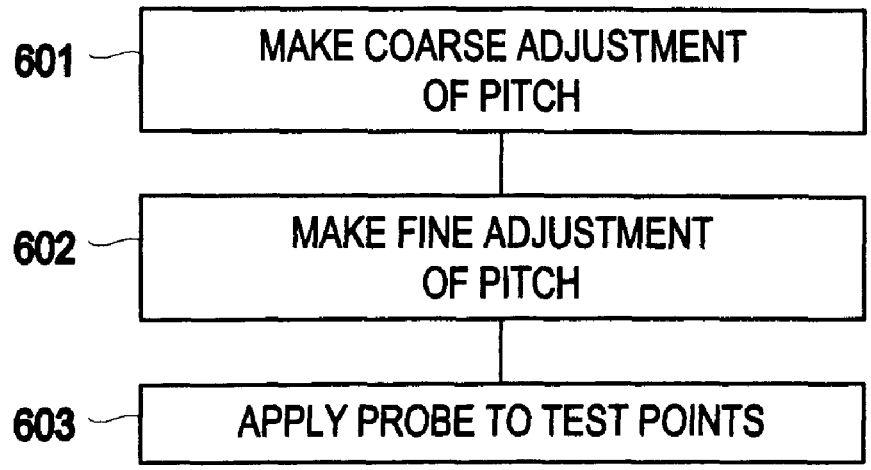
FIG. 6 shows an exemplary testing process 600 using the exemplary embodiment 200.

FIG. 6 shows an exemplary test process 600 using the adjustable probe of the present invention. In step 601, a coarse adjustment of the tip pitch is made using the alignment marks on the probe assembly (e.g., labels 211, 213 in FIG. 2). In step 602, a fine adjustment is made, typically using a magnification device to either compare the actual tip pitch with an accurate scale or compare the actual tip pitch against the test points themselves. Finally, in step 603, the test probe points are applied to the test points, typically using a mechanical holding fixture that holds the test probe assembly against the test points on the device under test.

Therefore, because of the delicate nature of working with microwave component wavelengths that typically involves using magnification for positioning a test probe, the probe assembly of the present invention might well be an accessory, a detachable component, or even a built-in component, of a larger test fixture used for testing microwave components, devices, chips, or wafers.

Apart from saving the inventory costs of stocking many different probe tip pitches, the adjustable probe of the present invention also provides the benefit of quick measurements of many different package and circuit geometries, without paying the penalty of fabrication lead time for these probes. It is often the case that the long lead time for these probes can represent a more significant economic penalty than the cost of the probes themselves.

While the invention has been described in terms of exemplary embodiments, those skilled in the art will recognize that the invention can be practiced with modification within the spirit and scope of the appended claims.

Further, it is noted that Applicants' intent is to encompass equivalents of all claim elements, even if amended later during prosecution.

Having thus described my invention, what I claim as new and desire to secure by Letters Patent is as follows:

1. A test probe assembly as comprising an adaptation of a micro-coaxial cable, said test probe assembly comprising:
   said micro-coaxial cable having at least one center conductor and a conductive outer wall;
   a probe tip section comprising at least one center contact, each respectively being a tip of one of said at least one center conductor of said micro-coaxial cable, and at least one peripheral contact, each electrically connected to said conductive outer wall of said micro-coaxial cable, wherein a pitch between said at least one center contact and said at least one peripheral contact is adjustable; and
   a sleeve that is longitudinally movable along said outer wall, wherein each said at least one peripheral contact is attached to said outer wall such that a longitudinal movement of said sleeve causes said adjustable pitch.

2. The test probe assembly of claim 1, wherein said probe is operable over a microwave range of wavelengths.

3. The test probe assembly of claim 1, wherein said outer wall incorporates a threaded interface and said sleeve includes an inner thread that engages therewith.

4. The test probe assembly of claim 1, wherein said at least one peripheral contact is shaped to provide a taper so that said longitudinal movement of said sleeve compresses said at least one peripheral contact by moving along said taper shape.

5. The test probe assembly of claim 1, further comprising:
   a calibration scale on said outer wall to provide an indication of a value of said pitch based on a position of said sleeve.

6. A test probe assembly as comprising an adaptation of a micro-coaxial cable, said test probe assembly comprising:
   said micro-coaxial cable having at least one center conductor and a conductive outer wall;
   a probe tip section comprising at least one center contact, each respectively being a tip of one of said at least one center conductor of said micro-coaxial cable, and at least one peripheral contact, each electrically connected to said conductive outer wall of said micro-coaxial cable, wherein a pitch between said at least one center contact and said at least one peripheral contact is adjustable; and
   a shorting device that maintains an electrical contact between said at least one peripheral contact and said outer wall substantially adjacent to where said at least one peripheral contact contacts a device under test, wherein said shorting device comprises a spreader that urges said at least one peripheral contact away from said at least one center contact.

7. The test probe assembly of claim 6, wherein said spreader comprises a metal spring.

8. A method of testing an electronic circuit, said method comprising:

making an adjustment of a contact pitch on an air coplanar waveguide (CPW) probe having an adjustable contact pitch, said CPW probe being an adaptation of a micro-coaxial cable such that at least one contact point of said probe comprises a center conductor of said micro-coaxial cable; and placing contacts of said CPW probe in contact with test points of said electronic circuit, wherein said making an adjustment of said contact pitch includes moving a sleeve along an outer wall of said CPW probe.

9. The method of claim 8, wherein said electronic circuit operates in a microwave range of wavelength.

10. The method of claim 8, wherein said sleeve includes an internal thread that engages a threaded section of said outer wall, and wherein said moving said sleeve includes rotating said sleeve to advance said sleeve along said threaded section.

11. A method of claim 8, wherein said making an adjustment comprises:

making a coarse adjustment based on a pitch indication on said probe; and subsequently making a fine adjustment based on viewing probe tips of said probe under a magnification device.

12. A method of fabricating a test probe assembly, said method comprising:

attaching at least one peripheral probe tip element to an outer wall of a micro-coax assembly having at least one center conductor, said center conductor being extended to serve as an inner probe element for testing a test point, said at least one peripheral probe tip element being attached to said outer wall a predetermined distance from an end of said inner probe element to be used to contact a test point; and incorporating an interface on said outer wall for a mechanism that allows said at least one peripheral probe tip element to be adjusted in separation from said at least one center conductor, wherein said mechanism comprises a moveable sleeve that moves longitudinally along said outer wall, a longitudinal location of said sleeve maintaining a position of said at least one peripheral probe tip element for said separation.

13. The fabrication method of claim 12, wherein said mechanism further comprises a flexible member substantially adjacent to an end of said outer wall, said flexible member urging said at least one peripheral probe tip element to be separated from said at least one center conductor.

* * * * *